United States Patent
Nam et al.

(10) Patent No.: US 9,136,487 B2
(45) Date of Patent: Sep. 15, 2015

(54) FLEXIBLE DISPLAY DEVICE AND METHOD OF MANUFACTURING THE SAME

(71) Applicant: LG DISPLAY CO., LTD., Seoul (KR)

(72) Inventors: Hyun-Chul Nam, Paju-si (KR); Chang-Hoon Jeon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/962,853

(22) Filed: Aug. 8, 2013

(65) Prior Publication Data
US 2014/0175463 A1   Jun. 26, 2014

(30) Foreign Application Priority Data

Dec. 21, 2012   (KR) .................... 10-2012-0151288

(51) Int. Cl.
*H01L 27/15*   (2006.01)
*H01L 51/00*   (2006.01)
*H01L 27/32*   (2006.01)

(52) U.S. Cl.
CPC ........ *H01L 51/0097* (2013.01); *H01L 27/3272* (2013.01); *H01L 27/3276* (2013.01); *H01L 2227/326* (2013.01); *H01L 2251/5315* (2013.01); *H01L 2251/5338* (2013.01); *Y02E 10/549* (2013.01)

(58) Field of Classification Search
CPC .................. H01L 2924/3025; H01L 27/3244; H01L 2224/3265; H01L 27/1214; H01L 27/1266; H01L 2251/5338

USPC ........... 257/88, 59, 40, 100; 438/29, 22, 149, 438/99
See application file for complete search history.

(56) References Cited

U.S. PATENT DOCUMENTS

| | | | |
|---|---|---|---|
| 2005/0007014 A1* | 1/2005 | Kurata ........................ | 313/504 |
| 2005/0130391 A1* | 6/2005 | Takayama et al. .......... | 438/458 |
| 2007/0080905 A1* | 4/2007 | Takahara .................... | 345/76 |
| 2011/0031480 A1* | 2/2011 | Nakamura et al. ......... | 257/40 |
| 2011/0273390 A1* | 11/2011 | Nakatsuji .................... | 345/173 |
| 2012/0045959 A1* | 2/2012 | Akimoto et al. ............ | 445/24 |
| 2012/0187386 A1* | 7/2012 | Matsumi ...................... | 257/40 |
| 2013/0200780 A1* | 8/2013 | Lee ............................. | 313/504 |

* cited by examiner

*Primary Examiner* — Jaehwan Oh
(74) *Attorney, Agent, or Firm* — Birch, Stewart, Kolasch & Birch, LLP

(57) ABSTRACT

A flexible display device is discussed. The flexible display device according to an embodiment includes an insulating and flexible substrate on which an adhesive layer is formed, a support layer adhered to the substrate via the adhesive layer, a cell array formed above the support layer, defining a plurality of pixel regions, and including a ground line connected to a ground voltage source of an external circuit, a light emitting array including a plurality of light emitting structures formed on the cell array, a sealing layer formed on the cell array, and a buffer layer, a shielding layer, and a bottom insulating layer formed between the support layer and the cell array. The light emitting array emits light toward the sealing layer, and the ground line is connected to the shielding layer through a contact hole to partially expose the shielding layer.

14 Claims, 11 Drawing Sheets

FLEXIBLE DISPLAY DEVICE AND METHOD OF MANUFACTURING THE SAME

This application claims the benefit of Korean Patent Application No. 10-2012-0151288, filed on Dec. 21, 2012, which is hereby incorporated by reference as if fully set forth herein.

BACKGROUND OF THE INVENTION

1. Field of the Invention

The present invention relates to a flexible display device and a method of manufacturing the same, and more particularly, to a flexible display device capable of preventing image quality deterioration caused by external noise and a method of manufacturing the same.

2. Discussion of the Related Art

With the advent of the information era, the field of displays that visually express electric information signals has rapidly developed. Correspondingly, diverse research is being conducted into flat display devices having excellent performance, such as slim design, light weight, and low power consumption.

Examples of flat display devices may include liquid crystal display (LCD) devices, plasma display panels (PDPs), field emission display (FED) devices, electroluminescent display (ELD) devices, electro-wetting display (EWD) devices, and organic light emitting display (OLED) devices. Such flat display devices essentially include a flat display panel for realizing an image.

The flat display panel is configured such that a pair of substrates opposite to each other are bonded to each other while interposing a light emitting material or a polarizing material therebetween.

Recently, as a flat display device, a flexible display device that includes a flexible substrate formed of a soft material such as plastic and metal and maintains display performance even after being bent like paper has been implemented. Since such flexible display devices have a broader range of applications than conventional display devices not having flexibility, research into commercializing flexible display devices has been conducted.

However, as a substrate formed of a soft material is flexible, careful attention is required to perform deposition of thin films, patterning, and the like to form a cell array and a light emitting structure thereon with a process error less than a critical point. Thus, a sacrificial substrate is generally used for processing convenience. According to a method of manufacturing a conventional flexible display device, processes of depositing and patterning thin films, and the like are performed to form a cell array and a light emitting structure using a sacrificial substrate, the sacrificial substrate is removed, and a substrate formed of a soft material is adhered thereto instead of the removed sacrificial substrate.

Meanwhile, since flat display devices such as flexible display devices including a cell array and a light emitting structure including thin films, image quality may be deteriorated due to external noise.

FIG. 1 illustrates image quality deterioration of a flexible display device caused by external noise according to related art.

As illustrated in FIG. 1, when external noise, such as contact, is applied to a flexible display device, spots influenced by external noise and marked with dashed lines are clearly recognizable. Accordingly, image quality deterioration may be identified.

Thus, a general flexible display device includes a conductive metal substrate connected to an external ground voltage source in order to block influence of external noise on image quality. In this case, a process of connecting the metal substrate to the external ground voltage source is further required after attachment of the metal substrate, and the flexible display device has increased thickness, decreased flexibility, and increased weight due to the metal substrate. In addition, since the metal substrate is reflective, it is not possible to perform foreign matter detection for a cell array and a light emitting array outside the metal substrate.

Alternatively, a general flexible display device includes an insulating plastic substrate, and a conductive film additionally attached to the outside of the plastic substrate and connected to an external ground voltage source to prevent flexibility deterioration and block influence of external noise on image quality. In this case, a separate conductive film needs to be prepared, and a process of attaching the conductive film to the plastic substrate and a process of connecting the conductive film to the ground voltage source are further required. As a result, manufacturing time and manufacturing costs are increased.

SUMMARY OF THE INVENTION

Accordingly, the present invention is directed to a flexible display device and a method of manufacturing the same that substantially obviate one or more problems due to limitations and disadvantages of the related art.

An object of the present invention is to provide a flexible display device that includes an insulating substrate and does not include a conductive film to prevent flexibility deterioration and is capable of blocking influence of external noise on image quality, and a method of manufacturing the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a flexible display device according to an embodiment includes an insulating and flexible substrate on which an adhesive layer is formed, a support layer adhered to the substrate via the adhesive layer, a buffer layer formed over the support layer, a shielding layer formed on the buffer layer, a bottom insulating layer formed over the buffer layer to cover the shielding layer, a cell array formed on the bottom insulating layer, defining a plurality of pixel regions, and including a ground line connected to a ground voltage source of an external circuit, a light emitting array including a plurality of light emitting structures formed on the cell array to correspond to the plurality of pixel regions, and a sealing layer formed on the cell array to seal the light emitting array. The light emitting array emits light toward the sealing layer, and the ground line is connected to the shielding layer through a contact hole penetrating at least one portion of the cell array and the bottom insulating layer to partially expose the shielding layer.

In another aspect of the present invention, a flexible display device includes an insulating and flexible substrate on which an adhesive layer is formed, a support layer adhered to the substrate via the adhesive layer, a shielding layer formed on the support layer, a bottom insulating layer formed over the support layer to cover the shielding layer, a buffer layer formed over the bottom insulating layer, a cell array formed on the buffer layer, defining a plurality of pixel regions, and including a ground line connected to a ground voltage source of an external circuit, a light emitting array including a plurality of light emitting structures formed on the cell array to correspond to the plurality of pixel regions, and a sealing layer formed on the cell array to seal the light emitting array. The light emitting array emits light toward the sealing layer, and the ground line is connected to the shielding layer through a contact hole penetrating at least one portion of the cell array, the buffer layer, and the bottom insulating layer to partially expose the shielding layer.

In another aspect of the present invention, a method of manufacturing a flexible display device includes forming a temporary layer on a sacrificial substrate, forming a support layer over the temporary layer, forming a buffer layer over the support layer, forming a shielding layer on the buffer layer, forming a bottom insulating layer over the buffer layer to cover the shielding layer, forming a cell array, which defines a plurality of pixel regions and includes a ground line connected to a ground voltage source of an external circuit, on the bottom insulating layer, forming a light emitting array including a plurality of light emitting structures corresponding to the pixel regions on the cell array, forming a sealing layer on the cell array to seal the light emitting array, separating the sacrificial substrate from the support layer using an interface between the temporary layer and the support layer, adhering a flexible and insulating substrate to the support layer, and connecting the external circuit to the cell array. The plurality of light emitting structures emit light toward the sealing layer in the forming of the light emitting array, and the ground line is connected to the shielding layer via a contact hole penetrating at least one portion of the cell array, the buffer layer, and the bottom insulating layer to partially expose the shielding layer, in the forming of the cell array.

In another aspect of the present invention, a method of manufacturing a flexible display device includes forming a temporary layer on a sacrificial substrate, forming a support layer over the temporary layer, forming a shielding layer on the support layer, forming a bottom insulating layer over the support layer to cover the shielding layer, forming a buffer layer over the bottom insulating layer, forming a cell array, which defines a plurality of pixel regions to correspond to the display region and includes a ground line connected to a ground voltage source of an external circuit, on the buffer layer, forming a light emitting array including a plurality of light emitting structures corresponding to the pixel regions on the cell array, forming a sealing layer on the cell array to seal the light emitting array, separating the sacrificial substrate from the support layer using an interface between the temporary layer and the support layer, and adhering a flexible and insulating substrate to the support layer, and connecting the external circuit to the cell array. The plurality of light emitting structures emit light toward the sealing layer in the forming of the light emitting array, and the ground line is connected to the shielding layer via a contact hole penetrating at least one portion of the cell array, the buffer layer, and the bottom insulating layer to partially expose the shielding layer, in the forming of the cell array.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

A flexible display device according to an embodiment of the present invention and a method of manufacturing the same will be described in detail.

First, a flexible display device according to an embodiment of the present invention will be described with reference to FIGS. 2 to 4.

Figure 1:
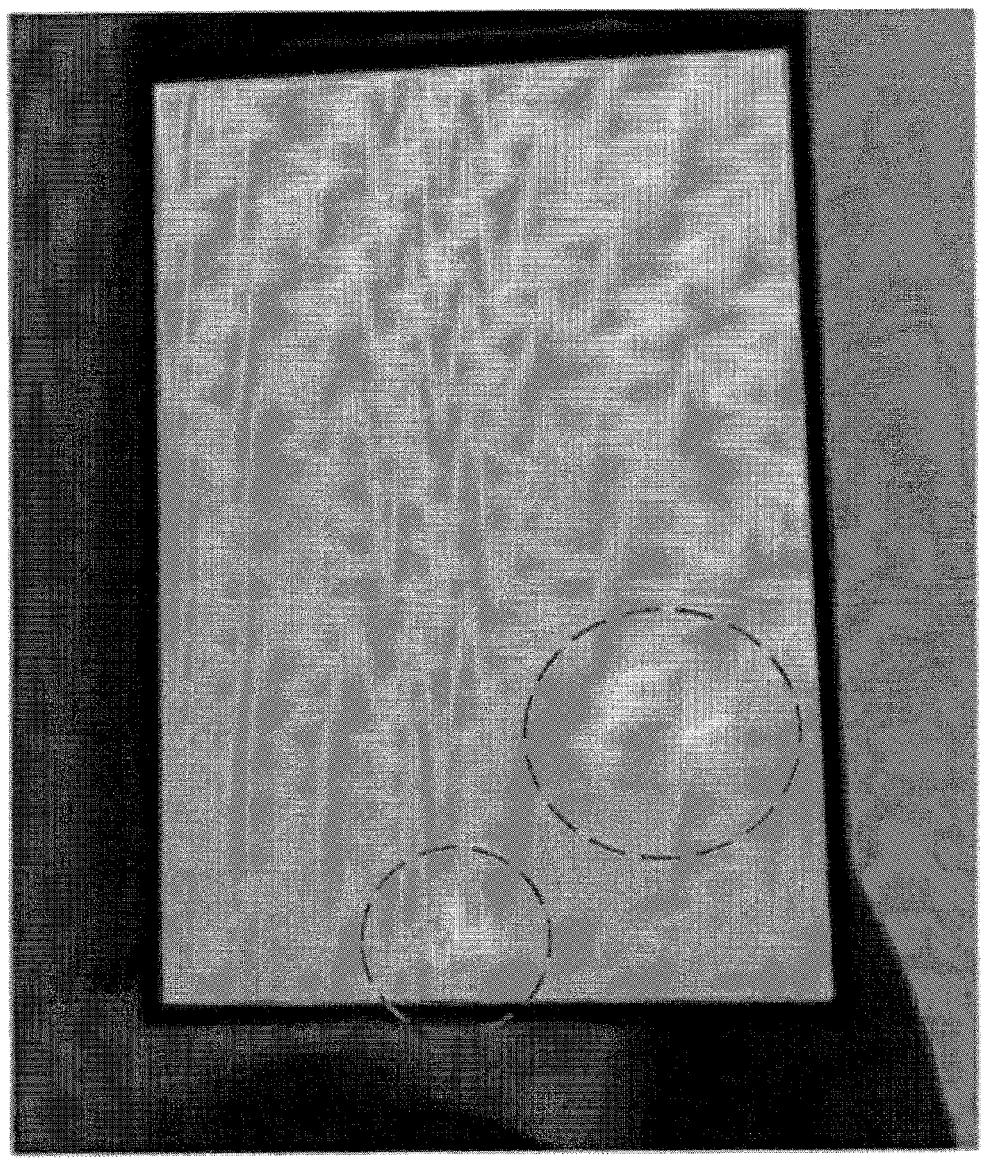
FIG. 1 illustrates image quality deterioration of a flexible display device caused by external noise according to a related art.
Figure 2:
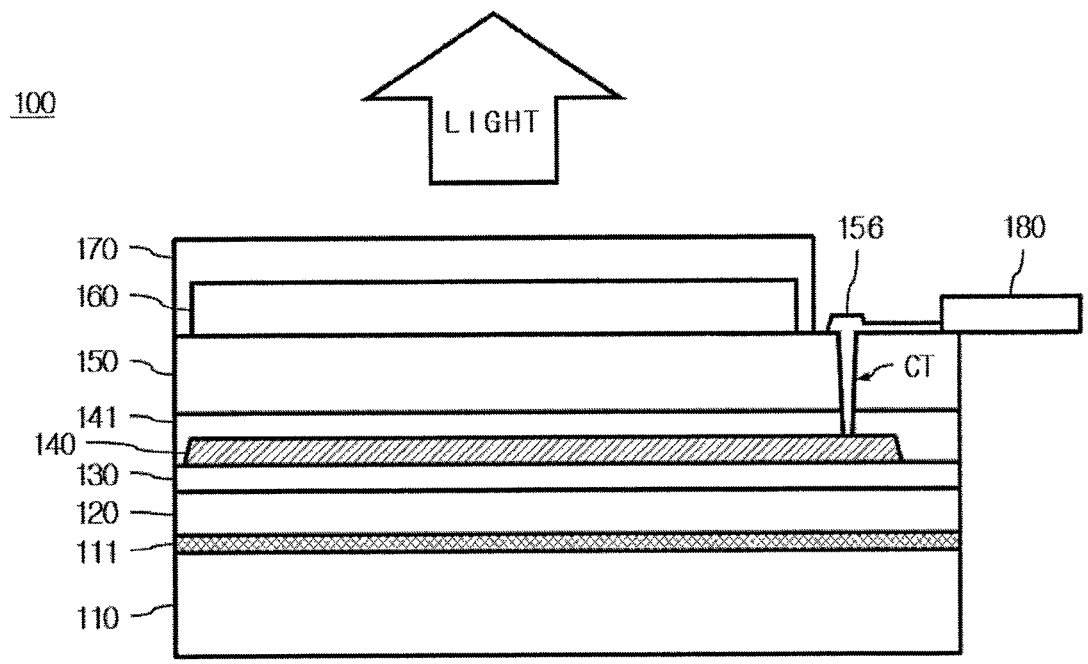
FIG. 2 is a cross-sectional view illustrating a flexible display device according to an embodiment of the present invention.

FIG. 2 is a cross-sectional view illustrating a flexible display device according to an embodiment of the present invention. FIG. 3 is a cross-sectional view illustrating a flexible display device according to another embodiment of the present invention. FIG. 4 is a cross-sectional view of an example of a cell array and a light emitting array of FIGS. 2 and 3.

As illustrated in FIG. 2, the flexible display device 100 includes a substrate 110, a support layer 120, a buffer layer 130, a shielding layer 140, a bottom insulating layer 141, a cell array 150, a light emitting array 160, and a sealing layer 170 which are sequentially laminated in a light emitting direction (upward in FIG. 2). In addition, a display surface of the flexible display device 100 has a display region to perform display of an image and a non-display region surrounding the display region. All the components of the flexible display device are in the embodiment and other embodiments are operationally coupled and configured.

The substrate 110 is formed of an insulating and flexible material. For example, the substrate 110 may be formed of a plastic material.

An adhesive layer 111 is formed on one surface of the substrate 110.

The support layer 120 is adhered to one surface of the substrate 110 by use of the adhesive layer 111. In this regard, the support layer 120 is an organic layer for supporting the cell array 150 and the light emitting array 160 after a sacrificial substrate, which is used to form the cell array 150 and the light emitting array 160, is removed and before adhesion to the substrate 110. For example, the support layer 120 may be formed of polyimide.

The buffer layer 130 is formed over the support layer 120. Here, the buffer layer 130 blocks moisture or oxygen infiltrating the substrate 110 and is formed of a material having low permeability. For example, the buffer layer 130 may be formed of an insulating layer including a combination of at least two selected from the group including nitrogen (N), oxygen (O), and silicon (Si), for example, silicon nitride (SiNx), and silicon oxide (SiO).

The shielding layer 140 is formed on the buffer layer 130 using a reflective metallic material. For example, the shielding layer 140 may include at least one selected from the group including Ti, Al, and Mo. In addition, the shielding layer 140 is formed to correspond to at least the display region and is connected to a ground line 156 of the cell array 150, which will be described later, to maintain a GND.

The shielding layer 140 shields influence of external noise on the cell array 150 and the light emitting array 160 to prevent image quality deterioration in the display region. Furthermore, the shielding layer 140 blocks moisture or oxygen infiltration through the substrate 110 together with the buffer layer 130 to prevent decrease in lifespan of the light emitting array 160 due to moisture or oxygen infiltration. In addition, the shielding layer 140 reflects light emitted from the light emitting array 160 toward the sealing layer 170 to further improve brightness of the display region.

The bottom insulating layer 141 is formed over the buffer layer 130 to cover the shielding layer 140. In this regard, the bottom insulating layer 141 is interposed between the shielding layer 140 and the cell array 150 to insulate the conductive shielding layer 140 and the cell array 150 mounted thereon from each other.

The cell array 150 is formed on the bottom insulating layer 141, defines a plurality of pixel regions so as to correspond to the display region and includes the ground line 156 connected to the ground voltage GND of an external circuit 180.

The cell array 150 includes gate lines and data lines aligned to intersect each other to define the pixel regions to correspond to the display region, and a plurality of driving switch devices respectively formed at intersections of the gate lines and the data lines to respectively correspond to the pixel regions. The cell array 150 may further include a wiring part disposed in the non-display region.

The wiring part includes a plurality of pads for connection with the external circuit 180 and a plurality of voltage lines for supplying various voltages to, for example, gate lines, data lines, and driving switch devices. For example, the voltage lines may be connected to a reference voltage source, a source voltage source, a drain voltage source, and a ground voltage source of the external circuit 180.

The ground line 156 is connected to the ground voltage source of the external circuit 180. In addition, the ground line 156 is connected to the shielding layer 140 via a contact hole CT, which penetrates at least one portion of the cell array 150 and the bottom insulating layer 141 to partially expose the shielding layer 140.

The light emitting array 160 includes a plurality of light emitting structures formed on the display region of the cell array 140 to correspond to the pixel regions. In this regard, the light emitting structures of the light emitting array 160 are formed to emit light upward to the sealing layer 170.

The light emitting structures may be any light emitting device capable of maintaining flexibility. For example, the light emitting structures may be E-paper devices, electro wetting devices, or organic light emitting devices (OLEDs).

For example, when an OLED is used as the light emitting structure, the OLED includes first and second electrodes opposite to each other and an organic light emitting layer interposed between the first and second electrodes.

The cell array 150 and the light emitting array 160 will be described in detail with reference to FIG. 4.

Then, the sealing layer 170 is formed over the cell array 150 to seal the light emitting array 160. In this regard, the sealing layer 170 is formed of a highly transparent and moistureproof insulating material to reduce loss of light from the light emitting array 160 and prevent moisture and oxygen from infiltrating the light emitting array 160.

Meanwhile, the shielding layer 140 according to the present invention may be disposed at any position between the support layer 120 and the cell array 150. Thus, FIG. 2 illustrates that the shielding layer 140 and the bottom insulating layer 141 are disposed between the buffer layer 130 and the cell array 150. However, the shielding layer 140 and the bottom insulating layer 141 may also be disposed between the support layer 120 and the buffer layer 130.

Figure 3:
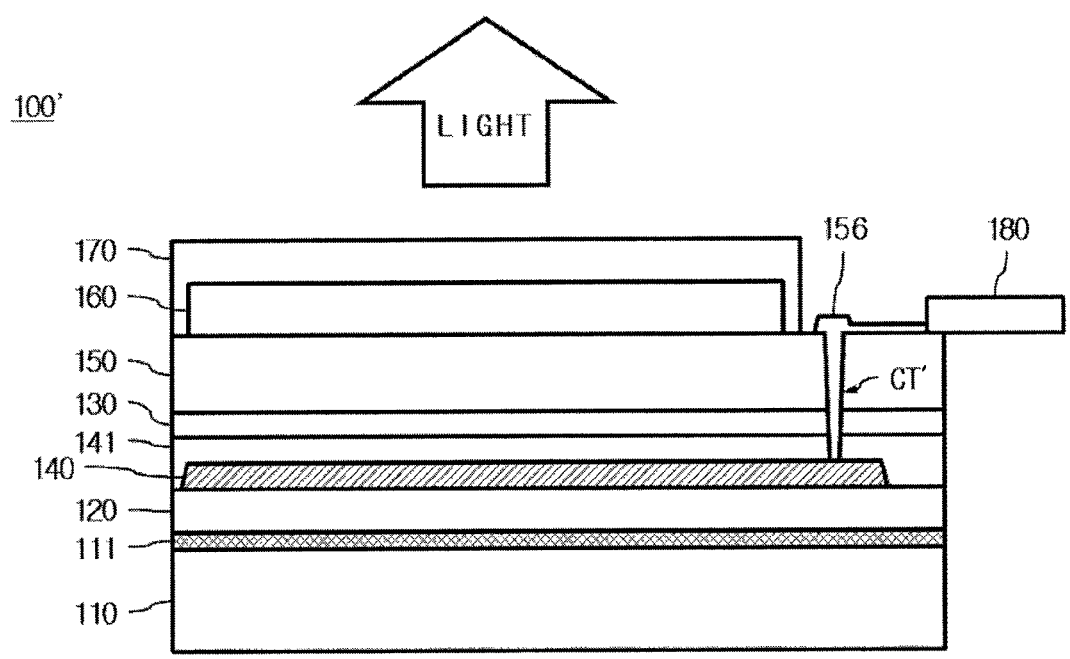
FIG. 3 is a cross-sectional view illustrating a flexible display device according to another embodiment of the present invention.

That is, as illustrated in FIG. 3, the flexible display device 100' according to another embodiment of the present invention has the same structure as that of the flexible display device 100 of FIG. 2, except that the shielding layer 140 is formed on the support layer 120, the bottom insulating layer 141 is formed over the support layer 120 to cover the shielding layer 140, the buffer layer 130 is formed over the bottom insulating layer 141, and a contact hole CT' connecting the ground line 156 and the shielding layer 140 is formed to penetrate at least one portion of the cell array 150, the buffer layer 130, and the bottom insulating layer 141. Thus, a detailed description of the flexible display device 100' will be omitted herein.

Next, the cell array 150 and the light emitting array 160 of FIGS. 2 and 3 will be described in detail.

As described above, the cell array 150 includes gate lines and data lines aligned to intersect each other to define a plurality of pixel regions and a plurality of driving switch devices respectively corresponding to the pixel regions.

Figure 4:
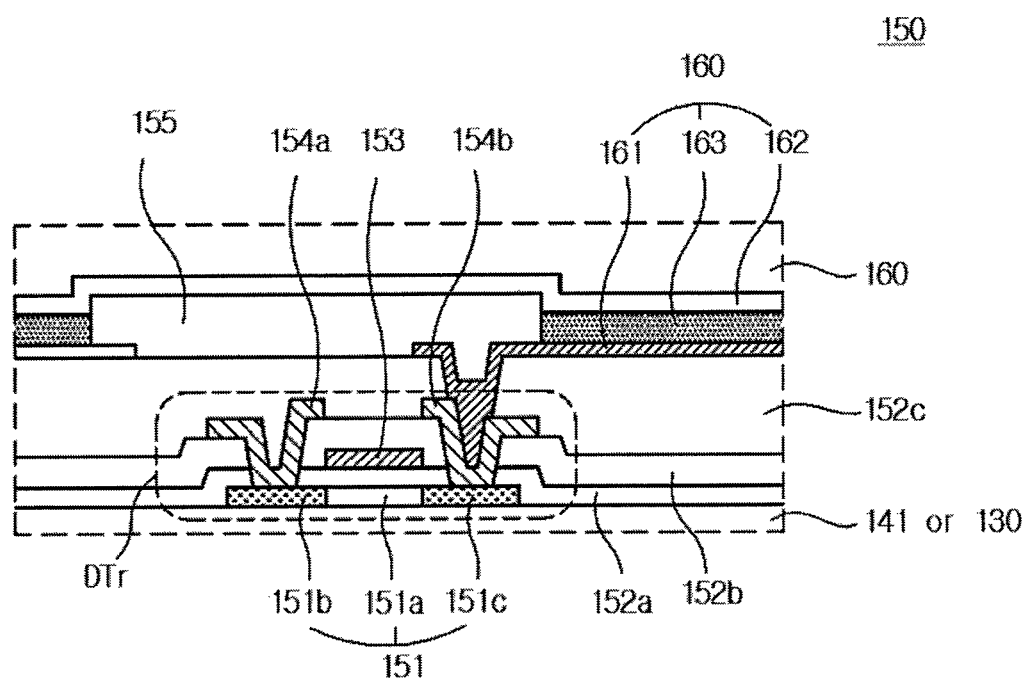
FIG. 4 is a cross-sectional view of an example of a cell array and a light emitting array of FIGS. 2 and 3.

As illustrated in FIG. 4, the cell array 150 includes a driving switch DTr including a semiconductor layer 151, a gate electrode 153 formed on a gate insulating layer 152a covering the semiconductor layer 151, a source electrode 154a and a drain electrode 154b which are formed on a first interlayer insulating layer 152b covering the gate electrode 153.

The semiconductor layer 151 is formed on the bottom insulating layer 141 or the buffer layer 130 according to the position of the shielding layer 140 (refer to FIGS. 2 and 3). The semiconductor layer 151 includes an active region 151a forming a channel based on a gate voltage applied to the gate electrode 153 and a source region 151b and a drain region 151b formed at both sides of the active region 151a by impurity doping.

The gate insulating layer 152a is formed over the bottom insulating layer 141 or the buffer layer 130 to cover the semiconductor layer 151 (refer to FIGS. 2 and 3).

The gate electrode 153 is formed on the gate insulating layer 152a to overlap at least one portion of the active region 151a of the semiconductor layer 151.

The first interlayer insulating layer 152b is formed over the gate insulating layer 152a to cover the gate electrode 153.

The source electrode 154a is formed on the first interlayer insulating layer 152b to overlap at least one portion of the source region 151b of the semiconductor layer 151 and is connected to the source region 151b through a source contact hole penetrating the first interlayer insulating layer 152b and the gate insulating layer 152a.

Then, the drain electrode 154b is formed on the first interlayer insulating layer 152b to overlap at least one portion of the drain region 151c of the semiconductor layer 151 and is connected to the drain region 151c through a drain contact hole penetrating the first interlayer insulating layer 152b and the gate insulating layer 152a.

A second interlayer insulating layer 152c is formed over the first interlayer insulating layer 152b to cover the source electrode 154a and the drain electrode 154b.

In addition, when the light emitting array 160 is an OLED, the light emitting array 160 includes a first electrode 161 corresponding to each pixel region, a second electrode 162 opposite to the first electrode 161, and an organic light emitting layer 163 interposed between the first and second electrodes 161 and 162.

Here, the first electrode 161 is connected to the drain electrode 154b via a pixel electrode hole penetrating the second interlayer insulating layer 152c. In addition, the first electrode 161 is formed of a reflective metallic material such that light emitted from the organic light emitting layer 163 is emitted to the outside through the second electrode 163 and the sealing layer 170, and the second electrode 163 is formed of a transparent conductive material such as ITO.

In addition, the organic light emitting layer 163 of the light emitting array 160 is formed to correspond to each pixel region by a bank 155. In this regard, the bank 155 is formed on the second interlayer insulating layer 152c as a partition corresponding to each edge of each of the pixel regions.

In addition, the contact hole CT of FIG. 2 may be formed to penetrate the first interlayer insulating layer 152b and the gate insulating layer 152a of the cell array 150 and the bottom insulating layer 141, and the ground line 156 may be formed in the same layer as the source and drain electrodes 154a and 154b after forming the contact hole CT.

In the same manner, the contact hole CT' of FIG. 3 may be formed to penetrate the first interlayer insulating layer 152b and the gate insulating layer 152a of the cell array 150, the buffer layer 130, and the bottom insulating layer 141.

As described above, the flexible display devices 100 and 100' according to embodiments of the present invention include the shielding layer 140 formed between the support layer 120 and the cell array 150 (refer to FIGS. 2 and 3). Accordingly, when the substrate 110 is formed of a plastic material that is more flexible than a metallic material, influence of external noise may be blocked without additionally including a conductive film.

In addition, the shielding layer 140, together with the buffer layer 130, may further shield moisture or oxygen infiltration through the substrate 110. Since light emitted from the light emitting array 160 is reflected by the shielding layer 140 toward the sealing layer 170, brightness in comparison to power consumption may be improved.

Thus, the flexible display devices 100 and 100' including the shielding layer 140 may block influence of external noise on the cell array 150 and light emitting array 160 although a metal substrate, which deteriorates characteristics thereof in terms of flexibility, thickness, and weight, is not used or an additional conductive film, which increases manufacturing time and manufacturing costs, is not used. As a result, image quality deterioration caused by external noise may be prevented, reduction in lifespan due to moisture or oxygen infiltration may be prevented, and brightness may further be improved.

Hereinafter, a method of manufacturing the flexible display device illustrated in FIG. 2 will be described.

Figure 5:
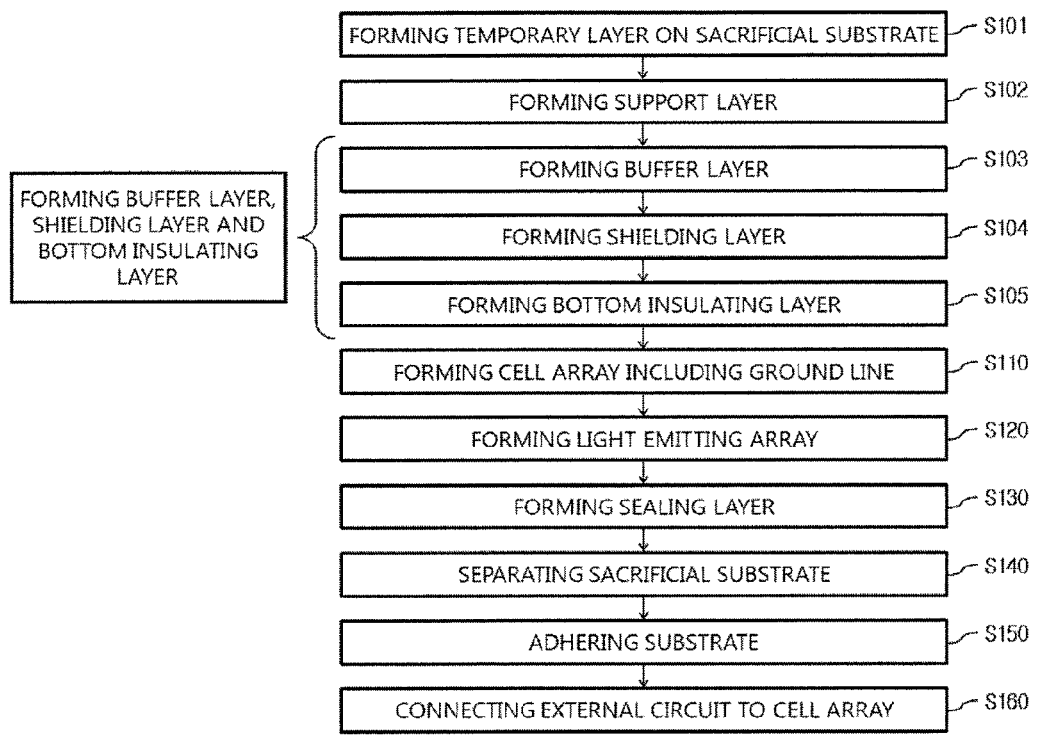
FIG. 5 is a flowchart illustrating a method of manufacturing the flexible display device of FIG. 2.

FIG. 5 is a flowchart illustrating a method of manufacturing the flexible display device of FIG. 2. FIGS. 6A to 6J are diagrams for describing each operation of the method shown in FIG. 5.

As illustrated in FIG. 5, the method of manufacturing the flexible display device illustrated in FIG. 2 includes forming a temporary layer on a sacrificial substrate (S101), forming a support layer over the temporary layer (S102), forming a buffer layer over the support layer (S103), forming a shielding layer on the buffer layer (S104), forming a bottom insulating layer over the buffer layer to cover the shielding layer (S105), forming a cell array, which defines a plurality of pixel regions to correspond to the display region and includes a ground line connected to a ground voltage source of an external circuit, on the bottom insulating layer (S110), forming a light emitting array including a plurality of light emitting structures corresponding to the pixel regions on the cell array (S120), forming a sealing layer on the cell array to seal the light emitting array (S130), separating the sacrificial substrate from the support layer using an interface between the temporary layer and the support layer (S140), adhering a flexible and insulating substrate to the support layer (S150), and connecting the external circuit to the cell array (S160).

Here, the light emitting structures are formed to emit light toward the sealing layer.

Figure 6A:
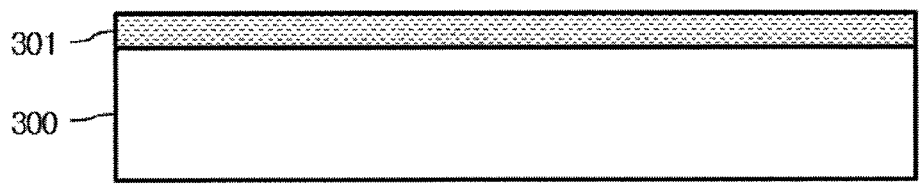
FIGS. 6A to 6J are diagrams for describing the method shown in FIG. 5.

As illustrated in FIG. 6A, a temporary layer 301 is formed on a sacrificial substrate 300 formed of a hard material (S101). For example, the sacrificial substrate 300 may be a sapphire substrate or a glass substrate. In addition, the temporary layer 301 may be formed of a material that easily loses adhesiveness by, for example, laser scanning, etching, and heat-treatment.

Figure 6B:
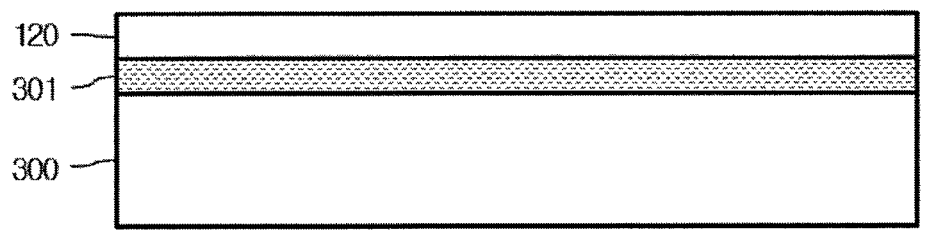

As illustrated in FIG. 6B, a support layer 120 is formed over the temporary layer 301 (S102). Here, the support layer 120 may be, for example, an organic layer formed of polyimide.

Figure 6C:
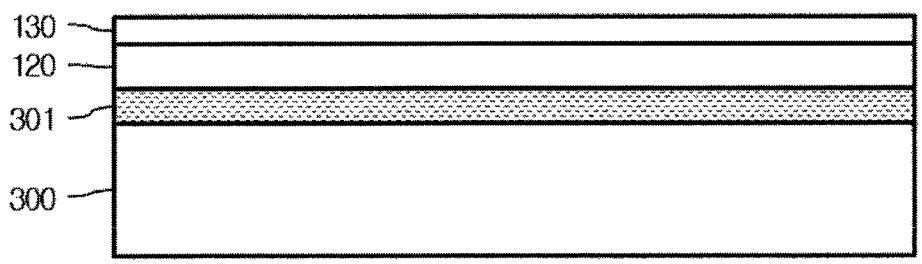

As illustrated in FIG. 6C, a buffer layer 130 is formed over the support layer 120 (S103). In this regard, the buffer layer 130 is formed of an insulating material having low permeability.

Figure 6D:
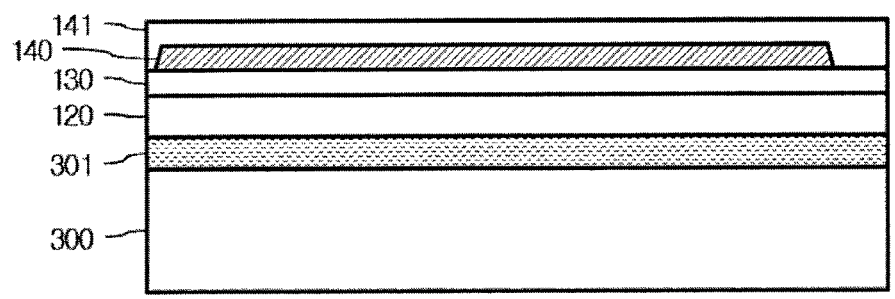

As illustrated in FIG. 6D, a shielding layer 140 is formed by laminating a reflective metallic material on the buffer layer 130 to correspond to at least display region (S104). For example, the shielding layer 140 may be formed of at least one selected from the group including Ti, Al, and Mo.

Then, a bottom insulating layer 141 is formed over the buffer layer 130 to cover the shielding layer 140 (S 105).

Figure 6E:
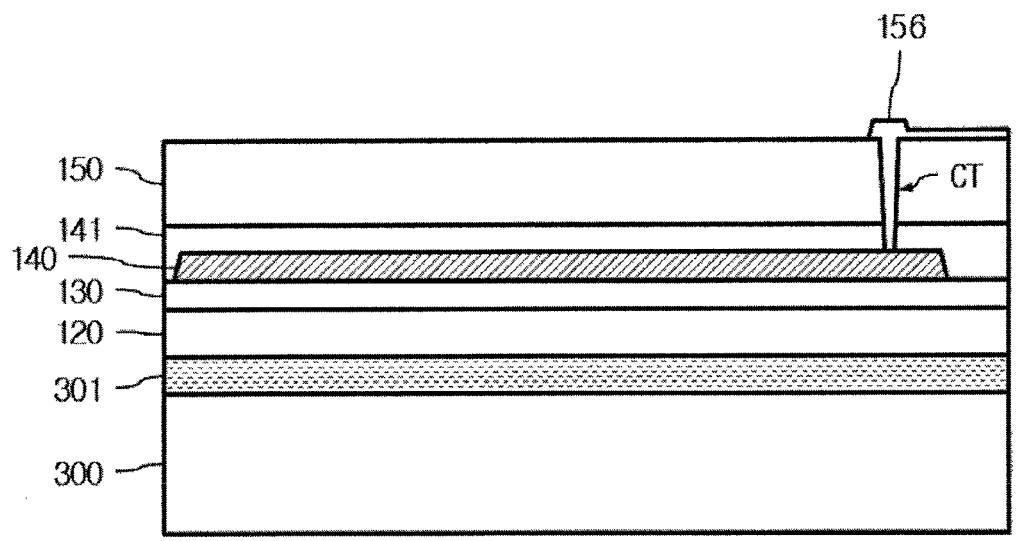

As illustrated in FIG. 6E, a cell array 150 is formed on the bottom insulating layer 141 (S110). In this regard, the cell array 150 includes gate lines and data lines aligned to intersect each other to define a plurality of pixel regions to correspond to the display region. In this regard, the cell array 150 further includes a ground line 156 connected to the shielding layer 140 via a contact hole CT that penetrates at least one portion of the cell array 150 and the bottom insulating layer 141.

Although not shown in FIG. 6E in detail, referring to FIG. 4, the forming of the cell array 150 (S 110) includes forming a semiconductor layer 151 on the bottom insulating layer 141, forming a gate insulating layer 152a to cover the semiconductor layer 151, forming a gate electrode 153 on the gate insulating layer 152a, forming a first interlayer insulating layer 152b to cover the gate electrode 153, forming a source electrode 154a and a drain electrode 154b, and forming a second interlayer insulating layer 152c to respectively cover the source electrode 154a and the drain electrode 154b.

In addition, the method further includes forming a contact hole CT that penetrates the first interlayer insulating layer 152b, the gate insulating layer 152a, and the bottom insulating layer 141 after forming the first interlayer insulating layer 152b. In addition, in the forming of the source electrode 154a and the drain electrode 154b, a ground line 156 that will be connected to a ground voltage source of an external circuit 180 of FIG. 6J and connected to the shielding layer 140 via the contact hole CT may further be formed.

Figure 6F:
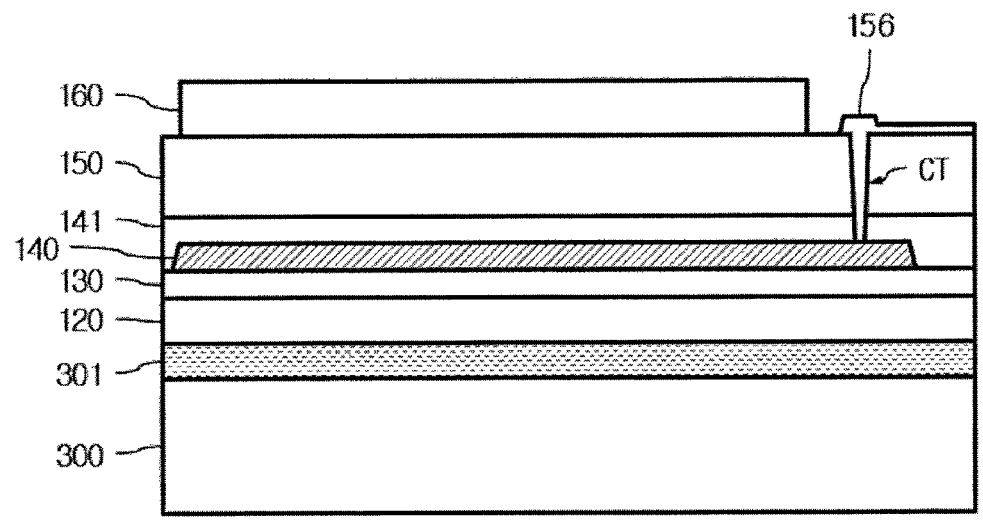

As illustrated in FIG. 6F, a light emitting array 160 including a plurality of light emitting structures corresponding to the pixel regions is formed on the cell array 150 (S120). In this regard, the light emitting structures are formed to emit light upward.

Although not shown in FIG. 6F in detail, referring to FIG. 4, the forming of the light emitting array 160 includes forming a bank 155 on the second interlayer insulating layer 152c to correspond to edges of the pixel regions, forming a pixel electrode hole that penetrates the second interlayer insulating layer 152c to expose at least one portion of the drain electrode 154b, forming a first electrode 161 on the second interlayer insulating layer 152c using a reflective metallic material to correspond to each pixel region and connect to the drain electrode 152 via the pixel electrode hole, forming an organic light emitting layer 163 on the first electrode 161 to correspond to each pixel region, and forming a second electrode 162 on the organic light emitting layer 163 using a transparent conductive material to commonly correspond to the pixel regions.

Figure 6G:
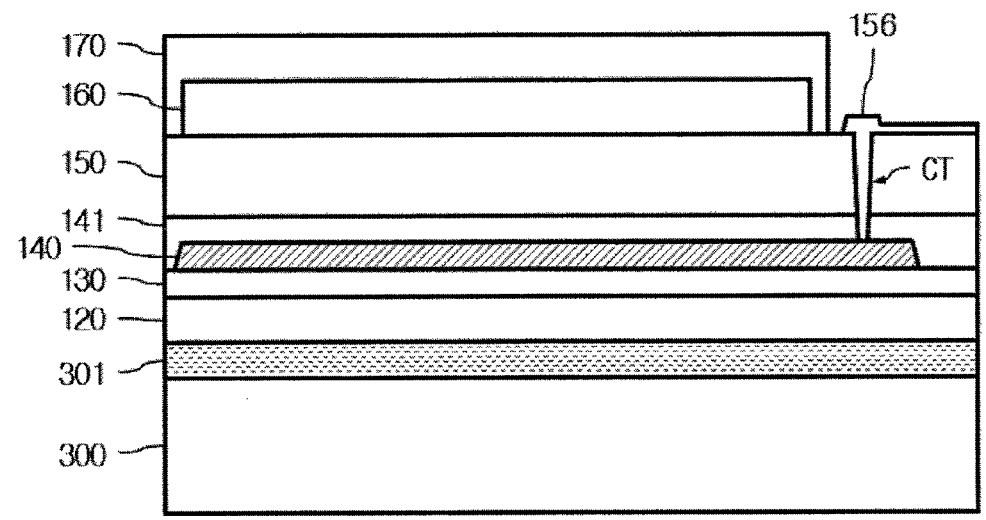

As illustrated in FIG. 6G, a sealing layer 170 is formed on the cell array 150 to seal the light emitting array 160 (S130). Here, the sealing layer 170 is formed of a highly transparent and moistureproof insulating material.

Figure 6H:
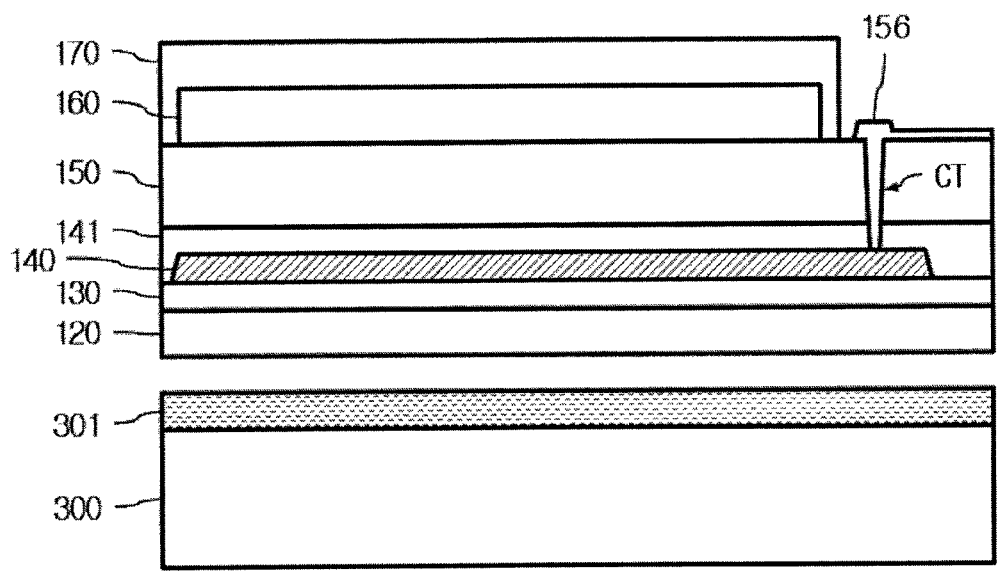

As illustrated in FIG. 6H, the sacrificial substrate 300 is separated from the support layer 120 by reducing adhesive force between the temporary layer 301 and the support layer 120 (S 140).

Figure 6I:
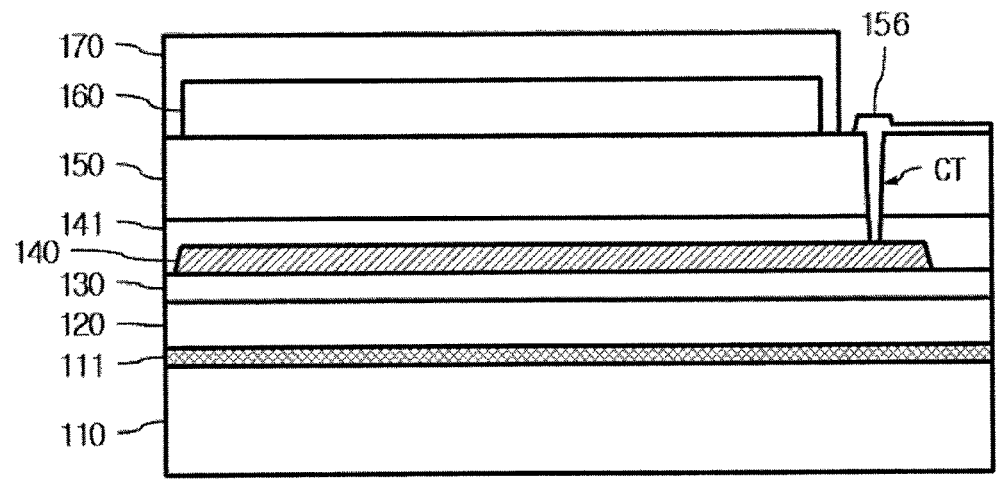

As illustrated in FIG. 6I, a substrate 110 provided with an adhesive layer 111 at one surface is adhered to the support layer 120 (S 150). In this regard, the substrate 110 is formed of an insulating and flexible material. For example, the substrate 110 may be formed of a plastic material.

Figure 6J:
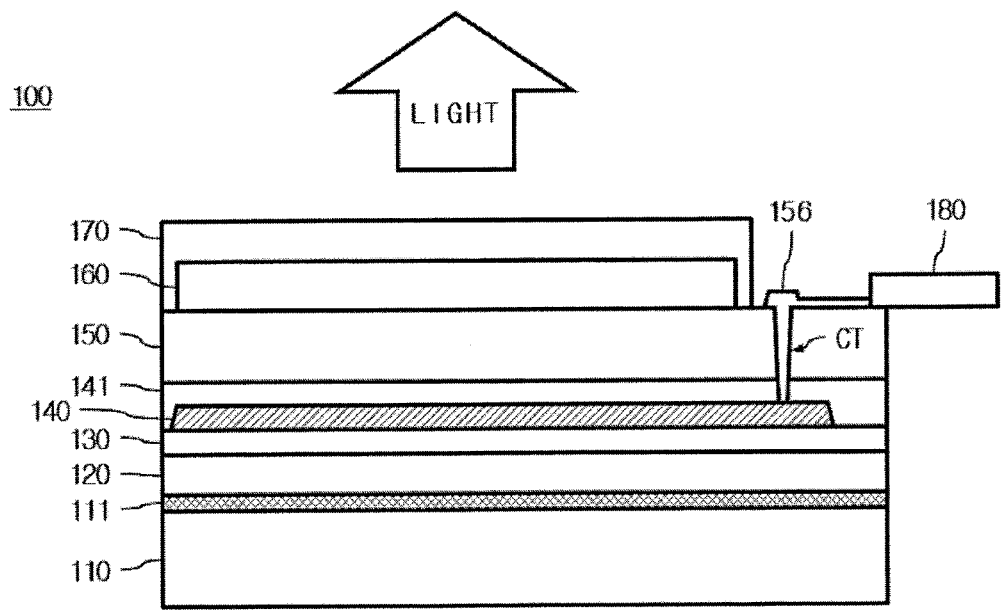

As illustrated in FIG. 6J, the external circuit 180 is connected to the cell array 150 (S160). In this regard, the ground line 156 is connected to the ground voltage source of the external circuit 180. Accordingly, the shielding layer 140 connected to the ground line 156 maintains the ground voltage GND level.

Figure 7:
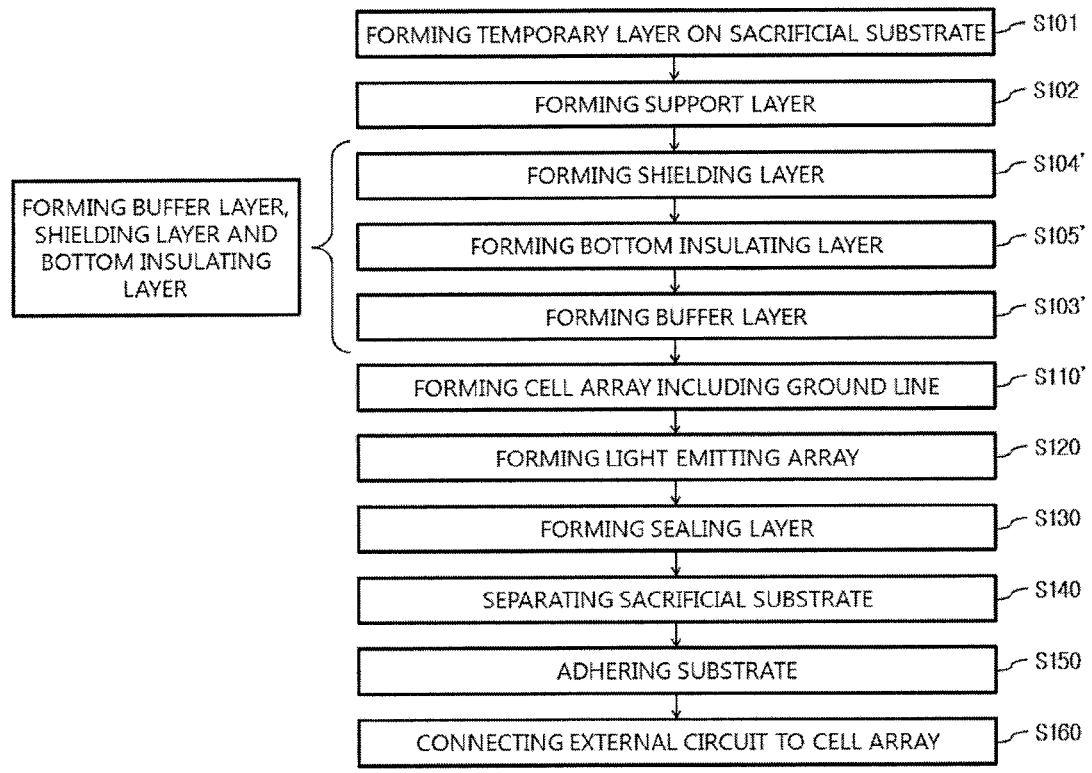
FIG. 7 is a flowchart illustrating a method of manufacturing the flexible display device of FIG. 3.

Meanwhile, FIG. 7 is a flowchart illustrating a method of manufacturing the flexible display device of FIG. 3.

As illustrated in FIG. 7, the method of manufacturing the flexible display device illustrated in FIG. 3 includes forming a temporary layer on a sacrificial substrate (S101), forming a support layer over the temporary layer (S102), forming a shielding layer on the support layer (S104'), forming a bottom insulating layer over the support layer to cover the shielding layer (S105'), forming a buffer layer over the bottom insulating layer (S103'), forming a cell array, which defines a plurality of pixel regions to correspond to the display region and includes a ground line connected to a ground voltage source of an external circuit, on the buffer layer (S110'), forming a light emitting array including a plurality of light emitting structures corresponding to the pixel regions on the cell array (S120), forming a sealing layer on the cell array to seal the light emitting array (S130), separating the sacrificial substrate from the support layer using an interface between the temporary layer and the support layer (S140), adhering a flexible and insulating substrate to the support layer (S 150), and connecting the external circuit to the cell array (S 160).

Here, the light emitting structures are formed to emit light toward the sealing layer.

In other words, the method of manufacturing the flexible display device illustrated in FIG. 3 is the same as the method described above with reference to FIGS. 6A to 6J, except that the method of FIG. 3 includes forming the shielding layer 140 on the support layer 120 (S104'), forming the bottom insulating layer 141 over the support layer 120 to cover the shielding layer 140 (S105'), and forming the buffer layer 130 over the bottom insulating layer 141 (S103') instead of operations S103, S104, and S105 of FIG. 5. In addition, according to the method of FIG. 3, the cell array 150 is formed on the buffer layer 130, and the ground line 156 is connected to the shielding layer 140 via a contact hole CT penetrating at least one portion of the cell array 150, the buffer layer 130, and the bottom insulating layer 141 in the forming of the cell array (S110'). Accordingly, a detailed description of FIG. 7 will not be given herein.

As described above, manufacturing time and manufacturing costs may be reduced according to embodiments of the present invention, since attachment of an additional conductive film to the substrate 110 is not required after the adhering of the substrate 110 to the support layer 120.

As described above, the flexible display device according to embodiments of the present invention includes a shielding layer disposed between a support layer and a cell array and connected to a ground line.

Due to the shielding layer, influence of external noise on image quality may be blocked even when a metal substrate is not used, or a separate conductive film is not attached to the substrate. Thus, influence of external noise on image quality may be blocked without deteriorating characteristics in terms of flexibility, thickness, and weight and without increasing manufacturing costs and manufacturing time.

In addition, moisture or oxygen infiltration may further be blocked using not only the buffer layer but also the shielding layer, thereby increasing lifespan.

In addition, since light emitted from a light emitting array is reflected by the shielding layer in the light emitting direction, brightness may be improved in comparison to power consumption.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A display device comprising:
    an insulating and flexible substrate on which an adhesive layer is formed;
    a support layer adhered to the substrate via the adhesive layer;
    a cell array formed above the support layer, defining a plurality of pixel regions;
    a light emitting array comprising a plurality of light emitting structures formed on the cell array to correspond to the plurality of pixel regions;
    a sealing layer formed on the cell array to seal the light emitting array;
    a buffer layer, a shielding layer, and a bottom insulating layer formed between the support layer and the cell array, wherein the light emitting array emits light toward the sealing layer; and
    a ground line formed in a contact hole partially exposing the shielding layer and connected between a ground voltage source of an external circuit and the shielding layer.

2. The display device according to claim 1, wherein:
the buffer layer is formed on the support layer;
the shielding layer is formed on the buffer layer; and
the bottom insulating layer is formed over the buffer layer to cover the shielding layer.

3. The display device according to claim 1, wherein the shielding layer corresponds to all of the plurality of pixel regions.

4. The display device according to claim 1, wherein the shielding layer is formed of at least one selected from the group comprising titanium (Ti), aluminum (Al), and molybdenum (Mo).

5. The display device according to claim 1, wherein the substrate is a plastic substrate.

6. A display device comprising:
a cell array comprising a plurality of driving switch devices, each of the driving switch devices including a semiconductor layer, a source electrode, a drain electrode, and a gate electrode;
a light emitting array comprising a plurality of light emitting structures to emit light upward from the cell array, each of the light emitting structures being formed on the drain electrode of each the driving switch devices, respectively;
at least one insulating layer formed under the cell array;
a shielding layer formed directly under the at least one insulating layer so that the top and sides of the shielding layer are covered by the at least one insulating layer, the shielding layer being formed of a reflective metallic material to reflect light emitted from the light emitting array; and
a ground line formed in a contact hole partially exposing the shielding layer and connected between a ground voltage source of an external circuit and the shielding layer.

7. The display device according to claim 6, wherein the cell array defines a plurality of pixel regions, and the plurality of light emitting structures correspond to the plurality of pixel regions, and
wherein the shielding layer corresponds to all of the plurality of pixel regions.

8. The display device according to claim 6, wherein the at least one insulating layer comprises a bottom insulating layer formed directly on the shielding layer and covering the top and sides of the shielding layer, and a buffer layer formed directly on the bottom insulating layer.

9. The display device according to claim 6, wherein the at least one insulating layer is a bottom insulating layer, and
wherein the shielding layer is formed of at least one selected from the group comprising titanium (Ti), aluminum (Al), and molybdenum (Mo).

10. The display device according to claim 6, wherein the at least one insulating layer is a buffer layer formed of a combination of at least two selected from the group including nitrogen (N), oxygen (O), and silicon (Si).

11. The display device according to claim 6, wherein the substrate is a plastic substrate.

12. The display device according to claim 1, wherein the ground line connected between the ground voltage source of the external circuit and the shielding layer is partially formed on the cell array.

13. The display device according to claim 6, wherein the ground line connected between the ground voltage source of the external circuit and the shielding layer is partially formed on the cell array.

14. The display device according to claim 1, further comprising:
wherein the cell array comprises a semiconductor layer, a gate electrode formed on a gate insulating layer covering the semiconductor layer, and a source electrode and a drain electrode formed on a first interlayer insulating layer covering the gate electrode, and
wherein the ground line connected between the ground voltage source of the external circuit and the shielding layer is partially formed on the cell array.

* * * * *